US009829017B2

(12) United States Patent
McClung et al.

(10) Patent No.: US 9,829,017 B2
(45) Date of Patent: Nov. 28, 2017

(54) MOUNTING DEVICE FOR TEMPORARILY AFFIXING AN AUXILIARY DEVICE TO A MOTOR CONTROL CENTER

(71) Applicant: MarTek Limited, Charleston, WV (US)

(72) Inventors: Charles Mark McClung, Elkview, WV (US); Russell Richard Safreed, III, Saint Albans, WV (US)

(73) Assignee: MARTEK LIMITED, Charleston, WV (US)

(*) Notice: Subject to any disclaimer, the term of this patent is extended or adjusted under 35 U.S.C. 154(b) by 0 days.

(21) Appl. No.: 15/254,043

(22) Filed: Sep. 1, 2016

(65) Prior Publication Data

US 2017/0112006 A1 Apr. 20, 2017

Related U.S. Application Data

(60) Provisional application No. 62/242,544, filed on Oct. 16, 2015.

(51) Int. Cl.
| H05K 5/02 | (2006.01) |
| F16B 2/06 | (2006.01) |
| F16B 2/18 | (2006.01) |
| F16M 13/02 | (2006.01) |
| H02B 1/00 | (2006.01) |
| H02B 3/00 | (2006.01) |

(52) U.S. Cl.
CPC .............. *F16B 2/065* (2013.01); *F16B 2/185* (2013.01); *F16M 13/022* (2013.01); *H02B 1/00* (2013.01); *H02B 3/00* (2013.01); *H05K 5/0204* (2013.01)

(58) Field of Classification Search
CPC ....... F16B 2/065; F16B 2/185; F16M 13/022; H05K 5/0204; H05K 5/0021; H05K 5/0256; H05K 5/02; H05K 5/0226; H05K 5/023
USPC ...................... 248/231.31, 27.1, 27.3, 226.11
See application file for complete search history.

(56) References Cited

U.S. PATENT DOCUMENTS

| 2,720,372 | A | * | 10/1955 | Gowan | ................ | F16M 11/041 |
| | | | | | | 248/186.2 |
| 4,487,523 | A | * | 12/1984 | Monroe | ................... | F16B 2/10 |
| | | | | | | 24/498 |
| 8,387,926 | B2 | * | 3/2013 | Runels | ...................... | F16L 3/18 |
| | | | | | | 248/228.2 |
| 9,337,629 | B2 | * | 5/2016 | Oneufer | .................... | H02B 1/48 |
| 9,512,714 | B2 | * | 12/2016 | Sobolewski | ............ | E21B 47/01 |
| 9,667,046 | B2 | * | 5/2017 | Thomas | ................... | H02G 3/08 |

(Continued)

*Primary Examiner* — Nkeisha Smith
(74) *Attorney, Agent, or Firm* — Thomas | Horstemeyer, LLP

(57) ABSTRACT

A mounting device enables detachable mounting of equipment against a face of a motor control center (MCC) unit. The face of the MCC unit has a plurality of protruding ports and an operating switch extending outwardly from the face. The protruding ports are designed to enable installation and removal of the MCC unit from a housing. The operating switch is designed to enable switching of electrical power within the MCC unit. The mounting device has a plate or bracket, a mechanism for attaching and un-attaching the plate or bracket to at least one of the protruding ports, and screw holes or other features to enable mounting of equipment to enable the equipment to engage the protruding ports, the operating switch, or both.

12 Claims, 3 Drawing Sheets

(56) References Cited

U.S. PATENT DOCUMENTS

| | | | |
|---|---|---|---|
| 2012/0024677 A1* | 2/2012 | Safreed, III | H01H 9/20 200/50.24 |
| 2014/0209443 A1* | 7/2014 | McClung | H01H 3/02 200/331 |
| 2015/0286115 A1* | 10/2015 | Koch | B62J 11/00 248/615 |
| 2017/0184675 A1* | 6/2017 | Freer | G01R 31/3277 |
| 2017/0209318 A1* | 7/2017 | Schroeder | A61G 3/00 |

* cited by examiner

MOUNTING DEVICE FOR TEMPORARILY AFFIXING AN AUXILIARY DEVICE TO A MOTOR CONTROL CENTER

CLAIM OF PRIORITY

This application claims the benefit of provisional application No. 62/242,544, filed Oct. 16, 2015, which is incorporated herein by reference in its entirety.

FIELD OF THE INVENTION

The present invention relates to electrical motor control centers and facilitating an easy and accurate way of temporarily affixing an auxiliary device to such equipment.

BACKGROUND OF THE INVENTION

In facilities that contain numerous electric motors, the motors are typically supplied through a grouping of motor starters known as a motor control center, or "MCC." Each motor starter is housed in an individual enclosure, referred to as a "bucket," or "cell". Multiple motor starters are then housed in a larger enclosure with a common power bus supplying the various motor starters. One of the features of a motor starter is a disconnect switch typically actuated by an operating switch located on the front of the bucket that can be used to de-energize the particular motor supplied by the motor starter. Another of the many benefits of a modern motor control center is that individual motor starters may be removed for maintenance, repair, or modification without the need to de-energize the entire motor control center.

Some motor control center units are equipped with a means of removing or "racking" the motor starter bucket from the energized bus of the MCC unit. One such embodiment utilizes a jackscrew that is accessed from a port on the face of the motor starter enclosure. A human operator typically inserts a tool to manually rotate the jackscrew.

SUMMARY OF THE INVENTION

The mounting device of the present invention enables equipment to be detachably mounted to a motor control center (MCC) unit to enable remote racking of the motor starter or some other function.

One embodiment, among others, is a mounting device for enabling detachable mounting of equipment against a face of a motor control center (MCC) unit. The face of the MCC unit has a plurality of protruding ports and an operating switch extending outwardly from the face. The protruding ports are designed to enable installation and removal of the MCC unit from a housing. The operating switch is designed to enable switching of electrical power within the MCC unit. In this embodiment, the mounting device comprises a planar plate having one or more apertures that are sized and shaped to enable the plurality of protruding ports extending outwardly from the front of the MCC unit to pass through the plate. The planar plate has a notch to enable placement of the plate against the face of the MCC unit without obstruction by the operating switch. The mounting device further comprises a clamping ring associated with the planar plate, the clamping ring defining in large part one of the apertures and designed to surround a substantial part of one of the protruding ports when the mounting device is placed against the face of the MCC unit. The clamping ring has a fixed end and a movable end. The mounting device further comprises an elongated screw extending through a side of the plate, the screw having a first end and a second end, the first end being attached to the movable end of the clamping device. The mounting device further comprises a means for attaching to the second end of the screw and enabling the screw to be forced in and out of the side of the plate, and a means for mounting equipment to the planar plate to enable the equipment to engage the protruding ports, the operating switch, or both.

Another embodiment of the invention is a mounting device that comprises a planar plate having one or more apertures that are sized and shaped to enable a plurality of protruding ports extending outwardly from a front of a motor control center (MCC) unit to pass through the plate. The mounting device further comprises a means for attaching and un-attaching the planer plate to at least one of the protruding ports, and a means for mounting equipment to the planar plate to enable the equipment to engage the protruding ports, the operating switch, or both.

Another embodiment of the invention is a mounting device that comprises a bracket, a means for attaching and un-attaching the bracket to at least one of the protruding ports, and a means for mounting equipment to the bracket to enable the equipment to engage the protruding ports, the operating switch, or both.

Other devices, objects, features, characteristics and methods of operation of the present invention, as well as the function and assembly of its elements will become more apparent in the "Detailed Description of Embodiments" and accompanying drawings and claims, all of which form part of this specification.

BRIEF DESCRIPTION OF THE SEVERAL VIEWS OF THE DRAWINGS

The various embodiments and features of the invention will be clearly depicted in the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF EMBODIMENTS

Figure 1:
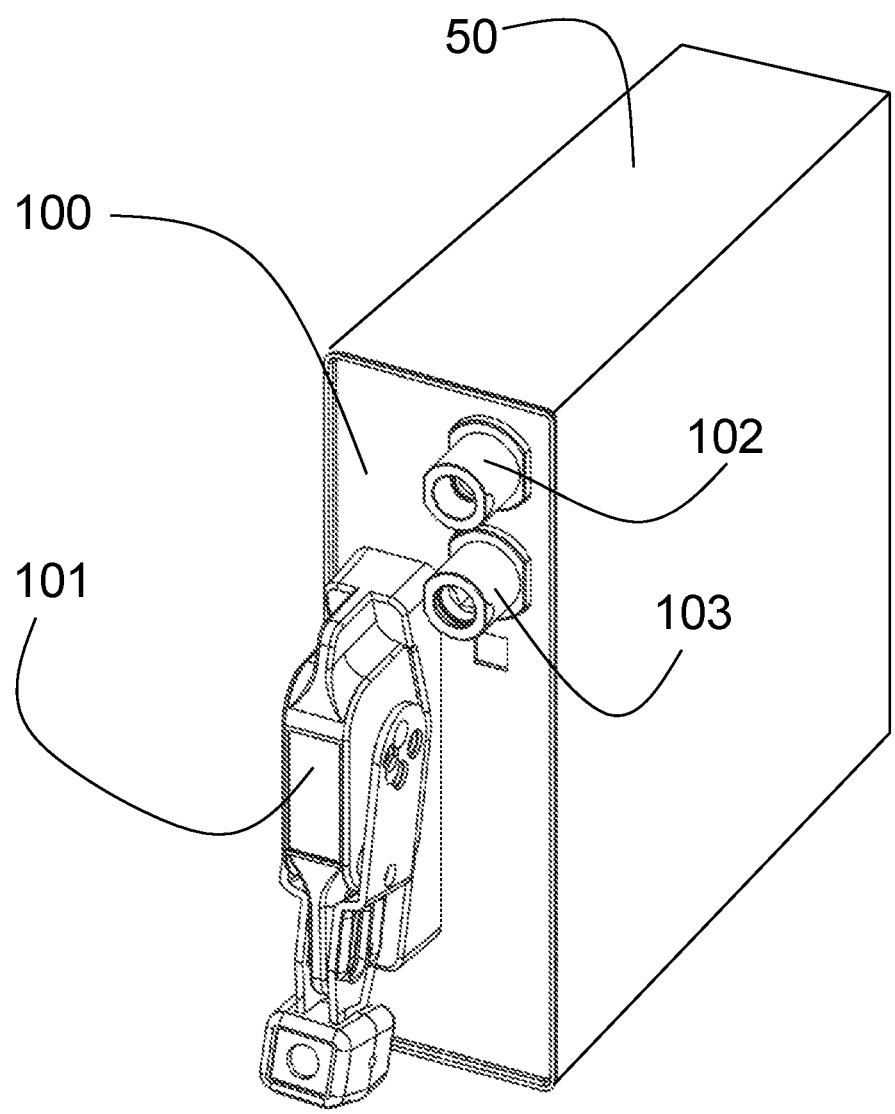
FIG. 1 is a typical motor starter operating handle and protruding ports that would be found on a typical motor starter.

With reference to FIG. 1, shown is a typical motor control center (MCC) unit 50 along with the MCC unit operating handle 101 and typical outwardly extending protruding ports 102 and 103 found on the front face 100 of the MCC unit 50. The MCC unit 50 can control electrical power to a motor, serve as a breaker that feeds a circuit to some external utilization device, etc. The backend housing of the MCC unit 50 is shown in phantom lines, as its shape, size, and configuration significantly changes from model to model. The protruding ports 102 and 103 as well as the operating handle 101 (switch) can be situated at different locations on the front 100, depending upon the type, manufacturer, etc. Exposed inside the front of the protruding port 103 is a female end (e.g., a hex screw) of a jackscrew that is rotated by an appropriate tool in order to remove the MCC unit 50. The protruding port 102 includes a push button that locks and unlocks the ability to rotate the jackscrew. The push button is pressed inward during the removal of the MCC unit 50.

Figure 2:
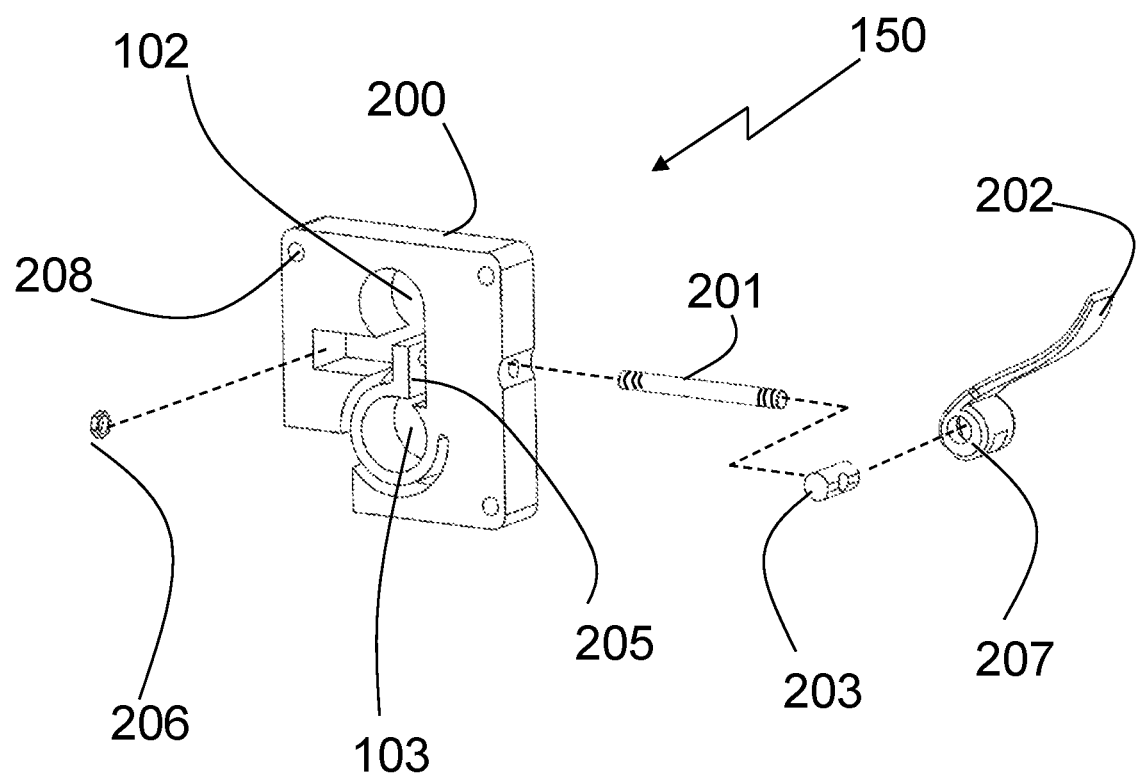
FIG. 2 is an example of a constricting device of the present invention that attaches to a protruding port found on modern motor starters.
Figure 3:
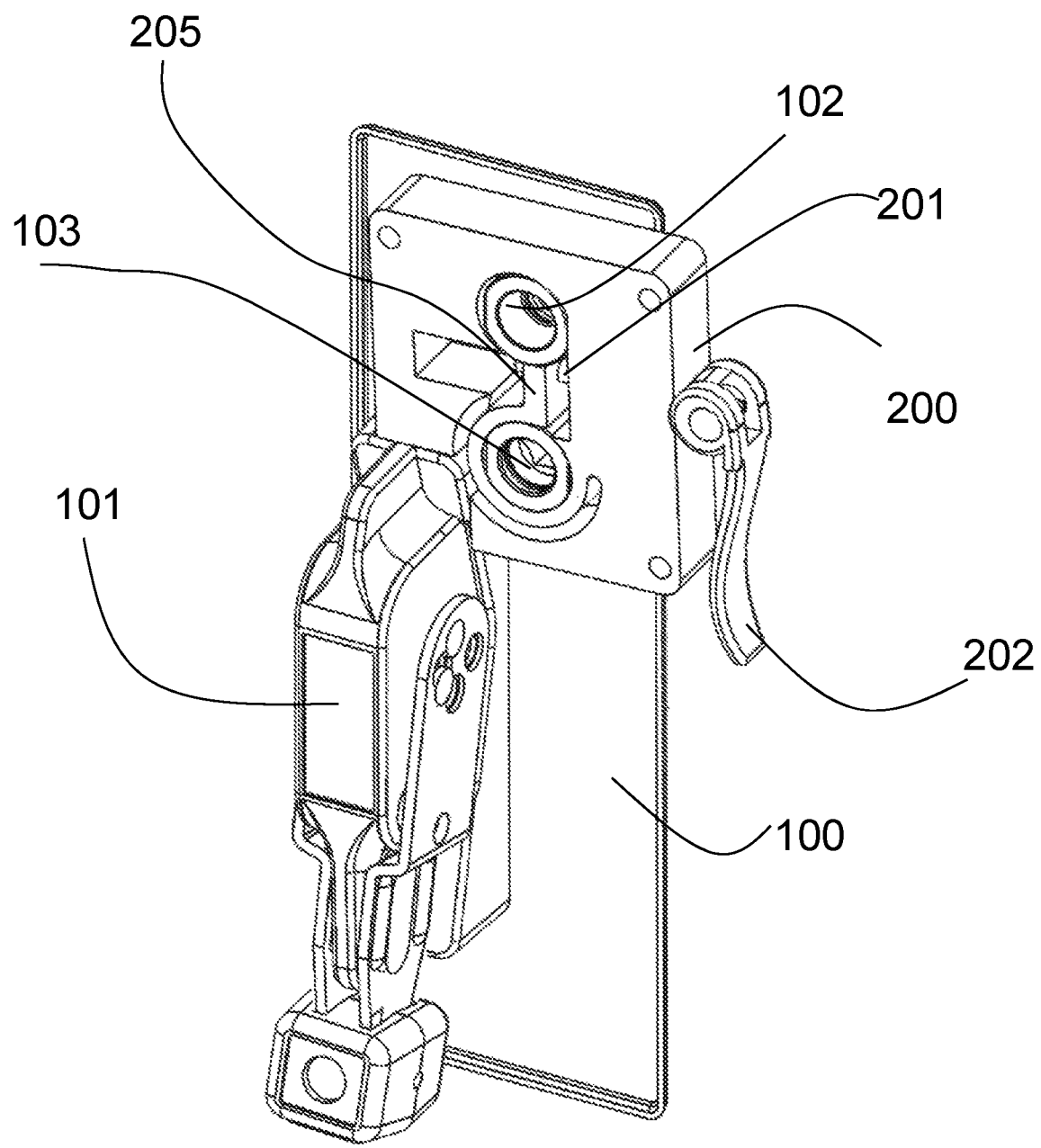
FIG. 3 shows the constricting device of the present invention attached to the protruding port on the motor starter shown in FIG. 1.

FIG. 2 shows an exploded assembly view of the mounting device 150 of the preferred embodiment. FIG. 3 shows the mounting device 150 installed on the front 100 of the MCC unit 50.

As shown in FIGS. 2 and 3, the mounting device 150 has a generally rectangular, planar, mounting plate 200 (or bracket) that is configured to align with protruding ports 102 and 103 found on the MCC unit 50. The mounting plate 200 is notched, as shown, to enable it to be placed against the front 100 of the MCC unit 50 without being obstructed by the operating handle 101. The mounting plate 200 includes apertures 102' and 103' for permitting the protruding ports 102 and 103, respectively, to pass through the mounting plate 200, as shown in FIG. 3.

Additional components which allow the mounting plate 200 to be firmly held in place are the elongated cylindrical tensioning screw 201, a curved tensioning switch 202, cylindrical tensioning switch nut 203, and a hexagonal retaining nut 206. The tensioning screw 201 is threaded at least at its ends for receiving and being affixed to the tensioning switch nut 203 and retaining nut 206. The curved tensioning switch 202 is designed with a cylindrical aperture to receive and rotate about the switch nut 203.

Within the mounting plate 200 is a circular clamping ring 205 that defines aperture 103' and that provides a frictional clamping force to the protruding port 103 when the mounting device 150 is installed. The tensioning switch 202 has a cylindrical aperture defined by a rim 207 that has a varied thickness throughout its turn so that when it is turned clockwise, the tensioning switch 202 pulls on the tensioning screw 201. Thus, when the tensioning switch 202 is rotated clockwise, because of its physical design, a tensioning force is applied to the tensioning screw 201, which pulls the top of the clamping ring 205 in a rightward direction in FIGS. 2 and 3. To disengage the mounting device 150 from the MCC unit 50, the tensioning switch 202 is rotated counterclockwise, which releases the pulling tension on the top of the clamping ring 205.

As further illustrated in FIG. 3, the preferred embodiment of the mounting plate 200 includes one or more threaded holes 208 (in the preferred embodiment, 3 holes) that can be used to mount equipment, for example, a gear box to engage the jackscrew associated with the protruding port 102 and/or 103, a device for actuating the operating handle 101, etc., to the mounting plate 200. In some embodiments, a gear box is attached to the mounting plate 200 and remotely actuated in a remote location in order to protect the operator from hazardous electrical discharge that sometimes occurs as the MCC unit 50 is installed or removed. In an alternative embodiment, the holes 208 can be replaced with, for example, one or more threaded studs, a mounting bracket, ferromagnetic material to enable a magnetic coupling of equipment to the assembly 200, etc.

Variations, Modifications, and Alternative Embodiments

It should be emphasized that the above-described embodiments of the present invention, particularly, any "preferred" embodiments, are merely possible non-limiting examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention.

One possible variation is an embodiment where the switch 202 and switch nut 203 are replaced with simply a threaded nut.

In another possible variation, the aperture 103 need not be circular in configuration. For example, the clamping ring 205 could be designed as an upwardly protruding vertical bar, connected at the bottom and movable at its top via the screw 201, to engage and exert frictional clamping force against the protruding port 103.

In another possible variation, the mounting device 150 could be designed so that the clamping ring 205 is positioned at the top, instead of the bottom, so that the protruding port 102 is clamped, instead of protruding port 103.

In another possible variation, the mounting device 150 could be designed so that a clamping ring 205 is also positioned at the top, in addition to at the bottom, so that the protruding ports 102 and 103 are both clamped when the device 150 is installed.

In another possible variation, the mounting device 150 could be designed without the clamping ring 205, but instead with a set screw that is used to press against one or both of the protruding ports 102 and 103 to hold the plate 200 against the front face of the MCC unit 50.

In another possible variation, the screw 206 could be eliminated by threading the upper part of the clamping ring 205 and enabling the screw 201 to be directly threaded into and attached to the upper part of the clamping ring 205.

In another possible variation, the aperture 102 of the plate 200 could be configured as merely a vertical channel extending upwardly from the top of the clamping ring 205 to the top edge of the plate 200.

In another possible variation, the planar plate 200 may be constructed by combining several different parts. In other words, it does not have to be constructed from a single piece of metal, as is shown in the figures.

At least the following is claimed:

1. A mounting device for enabling detachable mounting of equipment against a face of a motor control center (MCC) unit, the face of the MCC unit having a plurality of protruding ports and an operating switch extending outwardly from the face, the protruding ports designed to enable installation and removal of the MCC unit from a housing, the operating switch designed to enable switching of electrical power within the MCC unit, the mounting device comprising:

a planar plate having one or more apertures that are sized and shaped to enable the plurality of protruding ports extending outwardly from the front of the MCC unit to pass through the plate, the planar plate having a notch to enable placement of the plate against the face of the MCC unit without obstruction by the operating switch;

a clamping ring associated with the planar plate, the clamping ring defining in large part one of the apertures and designed to surround a substantial part of one of the protruding ports when the mounting device is placed against the face of the MCC unit, the clamping ring have a fixed end and a movable end;

an elongated screw extending through a side of the plate, the screw having a first end and a second end, the first end being attached to the movable end of the clamping ring;

means for attaching to the second end of the screw and enabling the screw to be forced in and out of the side of the plate; and means for mounting equipment to the planar plate to enable the equipment to engage the protruding ports, the operating switch, or both.

2. The mounting device of claim 1, wherein the mounting means includes one or more holes designed to enable the detachable mounting of the equipment to the plate.

3. The mounting device of claim 1, wherein the screw is threaded at the first and second ends, wherein the movable end of the clamping ring comprises a hole that receives the first end of the screw therethrough, and further comprising:
   a threaded nut that attaches to the screw at the first end to thereby attach the first end to the clamping ring;
   a cylindrical threaded switch nut that attaches to the second end of the screw; and
   a switch attached to the switch nut and designed to rotate the switch nut.

4. The mounting device of claim 1, further comprising the MCC unit.

5. A mounting device for enabling detachable mounting of equipment against a face of a motor control center (MCC) unit, the face of the MCC unit having a plurality of protruding ports and an operating switch extending outwardly from the face, the protruding ports designed to enable installation and removal of the MCC unit from a housing, the operating switch designed to enable switching of electrical power within the MCC unit, the mounting device comprising:
   a planar plate having one or more apertures that are sized and shaped to enable a plurality of protruding ports extending outwardly from a front of a motor control center (MCC) unit to pass through the plate;
   means for attaching and un-attaching the planar plate to at least one of the protruding ports;
   means for mounting equipment to the planar plate to enable the equipment to engage the protruding ports, the operating switch, or both; and
   wherein the means for attaching and un-attaching comprises:
      a clamping ring associated with the planar plate, the clamping ring defining in large part one of the apertures and designed to surround a substantial part of one of the protruding ports when the mounting device is placed against the face of the MCC unit, the clamping ring have a fixed end and a movable end;
      an elongated screw extending through a side of the plate, the screw having a first end and a second end, the first end being attached to the movable end of the clamping ring; and
      means for attaching to the second end of the screw and enabling the screw to be forced in and out of the side of the plate.

6. The mounting device of claim 5, wherein the screw is threaded at the first and second ends, wherein the movable end of the clamping ring comprises a hole that receives the first end of the screw therethrough, and further comprising:
   a threaded nut that attaches to the screw at the first end to thereby attach the first end to the clamping ring;
   a cylindrical threaded switch nut that attaches to the second end of the screw; and
   a switch attached to the switch nut and designed to rotate the switch nut.

7. A mounting device for enabling detachable mounting of equipment against a face of a motor control center (MCC) unit, the face of the MCC unit having a plurality of protruding ports and an operating switch extending outwardly from the face, the protruding ports designed to enable installation and removal of the MCC unit from a housing, the operating switch designed to enable switching of electrical power within the MCC unit, the mounting device comprising:
   a bracket;
   means for attaching and un-attaching the bracket to at least one of the protruding ports;
   means for mounting equipment to the bracket to enable the equipment to engage the protruding ports, the operating switch, or both; and
   wherein the means for attaching and un-attaching comprises:
      a clamping ring associated with the bracket, the clamping ring defining in large part one of the apertures and designed to surround a substantial part of one of the protruding ports when the mounting device is placed against the face of the MCC unit, the clamping ring have a fixed end and a movable end;
      an elongated screw extending through a side of the bracket, the screw having a first end and a second end, the first end being attached to the movable end of the clamping ring; and
      means for attaching to the second end of the screw and enabling the screw to be forced in and out of the side of the bracket.

8. The mounting device of claim 7, wherein the bracket comprises a plate having one or more apertures that are sized and shaped to enable the plurality of protruding ports extending outwardly from the front of the MCC unit to pass through the plate.

9. The mounting device of claim 8, wherein the plate has a cut out section to enable placement of the plate against the face of the MCC unit without obstruction by the operating switch.

10. The mounting device of claim 7, wherein the screw is threaded at the first and second ends, wherein the movable end of the clamping ring comprises a hole that receives the first end of the screw therethrough, and further comprising:
   a threaded nut that attaches to the screw at the first end to thereby attach the first end to the clamping ring;
   a cylindrical threaded switch nut that attaches to the second end of the screw; and
   a switch attached to the switch nut and designed to rotate the switch nut.

11. The mounting device of claim 7, wherein the mounting means includes one or more holes designed to enable the detachable mounting of the equipment to the bracket.

12. The mounting device of claim 7, further comprising the MCC unit.

* * * * *